United States Patent
Naqvi et al.

(10) Patent No.: US 6,629,254 B1
(45) Date of Patent: Sep. 30, 2003

(54) CLOCKING ARCHITECTURE TO COMPENSATE A DELAY INTRODUCED BY A SIGNAL BUFFER

(75) Inventors: Syed R. Naqvi, Tempe, AZ (US); James T. Doyle, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 472 days.

(21) Appl. No.: 09/607,565

(22) Filed: Jun. 29, 2000

(51) Int. Cl.[7] .............................. G06F 1/12; G06F 1/04; H03L 7/00; H03L 7/06
(52) U.S. Cl. ..................... 713/401; 713/400; 713/500; 713/600; 327/2; 327/141; 327/158
(58) Field of Search ................................. 713/400, 401, 713/600, 500; 365/230.08, 233; 326/41; 327/2, 141, 158

(56) References Cited

U.S. PATENT DOCUMENTS

| | | | | |
|---|---|---|---|---|
| 5,120,990 A | * | 6/1992 | Koker | 327/2 |
| 5,956,290 A | * | 9/1999 | Matsuzaki | 365/233 |
| 6,044,124 A | * | 3/2000 | Monahan et al. | 375/376 |
| 6,108,266 A | * | 8/2000 | Weier et al. | 365/230.08 |
| 6,140,854 A | * | 10/2000 | Coddington et al. | 327/158 |
| 6,177,844 B1 | * | 1/2001 | Sung et al. | 331/25 |
| 6,215,326 B1 | * | 4/2001 | Jefferson et al. | 326/41 |
| 6,295,563 B1 | * | 9/2001 | Whittaker | 710/52 |
| 6,366,150 B1 | * | 4/2002 | Ishimi | 327/276 |
| 6,437,650 B1 | * | 8/2002 | Sung et al. | 331/25 |
| 6,476,653 B1 | * | 11/2002 | Matsuzaki | 327/158 |
| 6,483,871 B1 | * | 11/2002 | Dawe | 375/226 |
| 6,501,309 B1 | * | 12/2002 | Tomita | 327/158 |
| 6,529,945 B1 | * | 3/2003 | Calhoun et al. | 709/213 |

FOREIGN PATENT DOCUMENTS

| | | | |
|---|---|---|---|
| JP | 406102964 A | * | 4/1994 |
| JP | 411074875 A | * | 3/1999 |
| JP | 02000059210 A | * | 2/2000 |

OTHER PUBLICATIONS

Takahiko Saba et al., "Synchronization Characteristics of Dual Delay Lock Loop in the Presence of Code Dopple", 1998, pp. 828–831.*

Inchul Hwang et al., "A Digitall controlled Phase–locked Loop with Fast Locking Scheme for Clock Synthesis Application", 2000 IEEE International Solid–State Circuits Conference, pp. 168–169.*

* cited by examiner

Primary Examiner—Thomas Lee
Assistant Examiner—Chun Cao
(74) Attorney, Agent, or Firm—Trop, Pruner & Hu, P.C.

(57) ABSTRACT

An apparatus includes a memory buffer, a first signal buffer, a locked loop circuit and a feedback circuit. The memory buffer provides a data signal to an output terminal of the memory buffer in response to a first clock signal. The first signal buffer is coupled between the output terminal of the memory buffer and a data line of a bus. The first signal buffer introduces a first delay. The locked loop circuit furnishes the first clock signal to establish a predefined relationship between a phase of a second clock signal and a phase of a third clock signal. The feedback circuit produces the second clock signal in response to the first clock signal. The feedback circuit includes a second signal buffer to introduce a second delay to the second clock, and the second delay is approximately the same as the first delay that is introduced by the first signal buffer.

28 Claims, 3 Drawing Sheets

CLOCKING ARCHITECTURE TO COMPENSATE A DELAY INTRODUCED BY A SIGNAL BUFFER

BACKGROUND

The invention generally relates to a clocking architecture.

A typical computer system may include a bridge to transfer data between busses of the computer system. For example, the bridge may include a memory interface to control the storage and retrieval of data from a system memory. To accomplish this, the memory interface typically initiates read and write operations over a memory bus that is coupled between the memory interface and the system memory.

For example, for a write operation, the memory interface may furnish data signals to data lines (of the memory bus) that indicate data for the write operation. Typically, the memory interface ensures that the data signals are synchronized to a system clock signal that is used to synchronize transactions that occur over the memory bus.

The memory interface typically includes signal buffers (one for each data line) to drive the data lines of the bus with the data signals during a write operation. Each buffer may introduce a significant delay to its data signal and thus, cause the data signal to lose synchronization with the clock signal. One solution is to couple delay lines in series with the clock and data lines to achieve synchronization. However, the lengths of the data lines may vary, and the circuitry that is connected to the data lines may introduce different loads on the data lines, thereby placing different loads on the signal buffers and causing the signal buffers to introduce different delays. Thus, it may be very difficult to synchronize the data and clock signals using this technique.

Thus, there is a continuing need for an arrangement that addresses one or more of the problems that are stated above.

DETAILED DESCRIPTION

Figure 1:
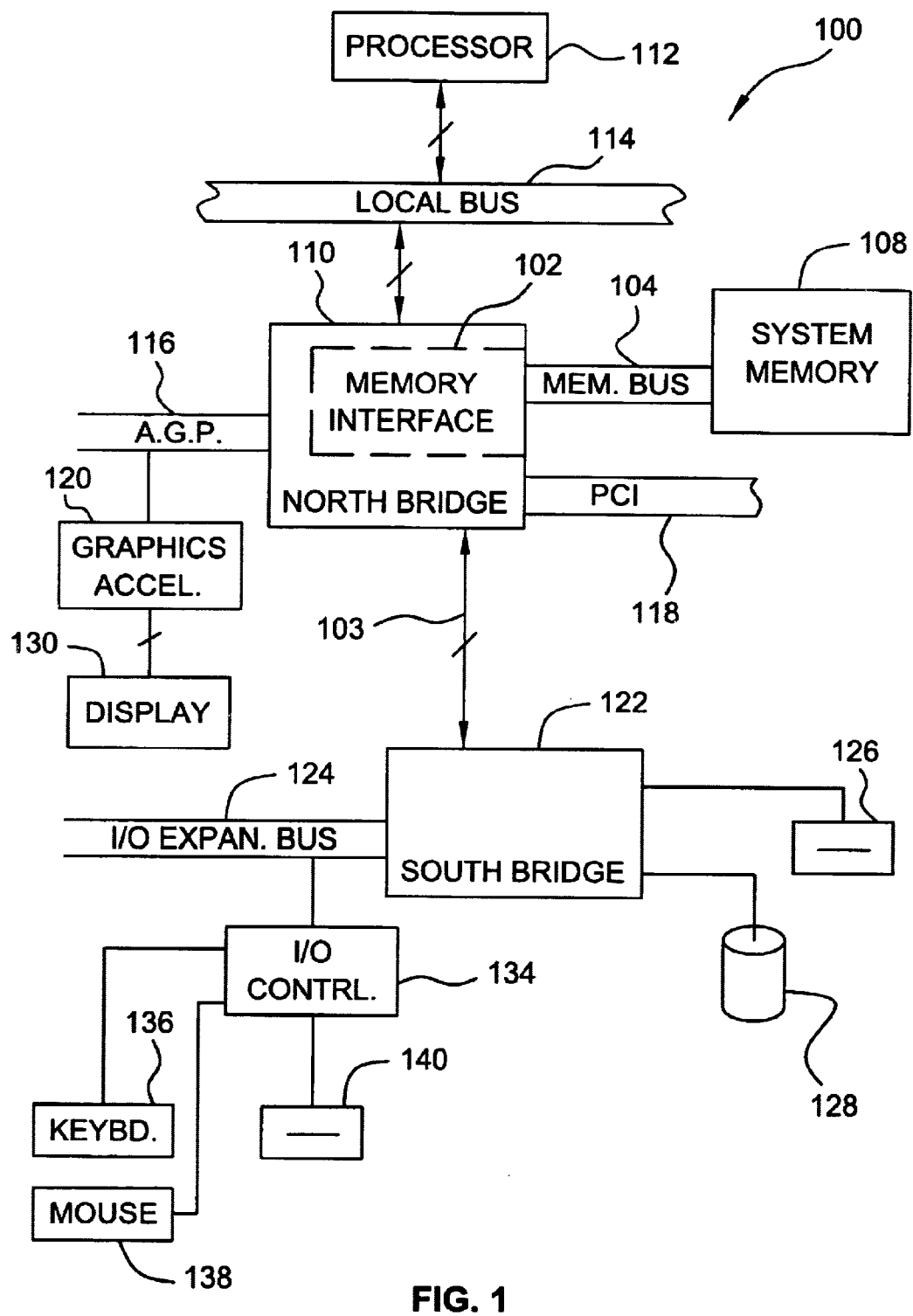
FIG. 1 is a schematic diagram of a computer system according to an embodiment of the invention.

Referring to FIG. 1, an embodiment 100 of a computer system in accordance with the invention includes a north bridge 110 to transfer data between different buses of the computer system 100. For example, the north bridge 110 may include a memory interface 102 to store and retrieve data from a system memory 108 via a memory bus 104. In this manner, when storing data in the system memory 108, the memory interface 102 furnishes data signals to data lines of the memory bus 104. Ideally, the data signals are synchronized to a system clock signal (called SCLK). However, if not for the synchronizing features (described below) of the memory interface 102, synchronization may not occur due to such factors as the loading on the data lines and the lengths of the data lines, factors that cause the signal buffers that drive the data signals onto the data lines to introduce different delays to the data signals.

Figure 2:
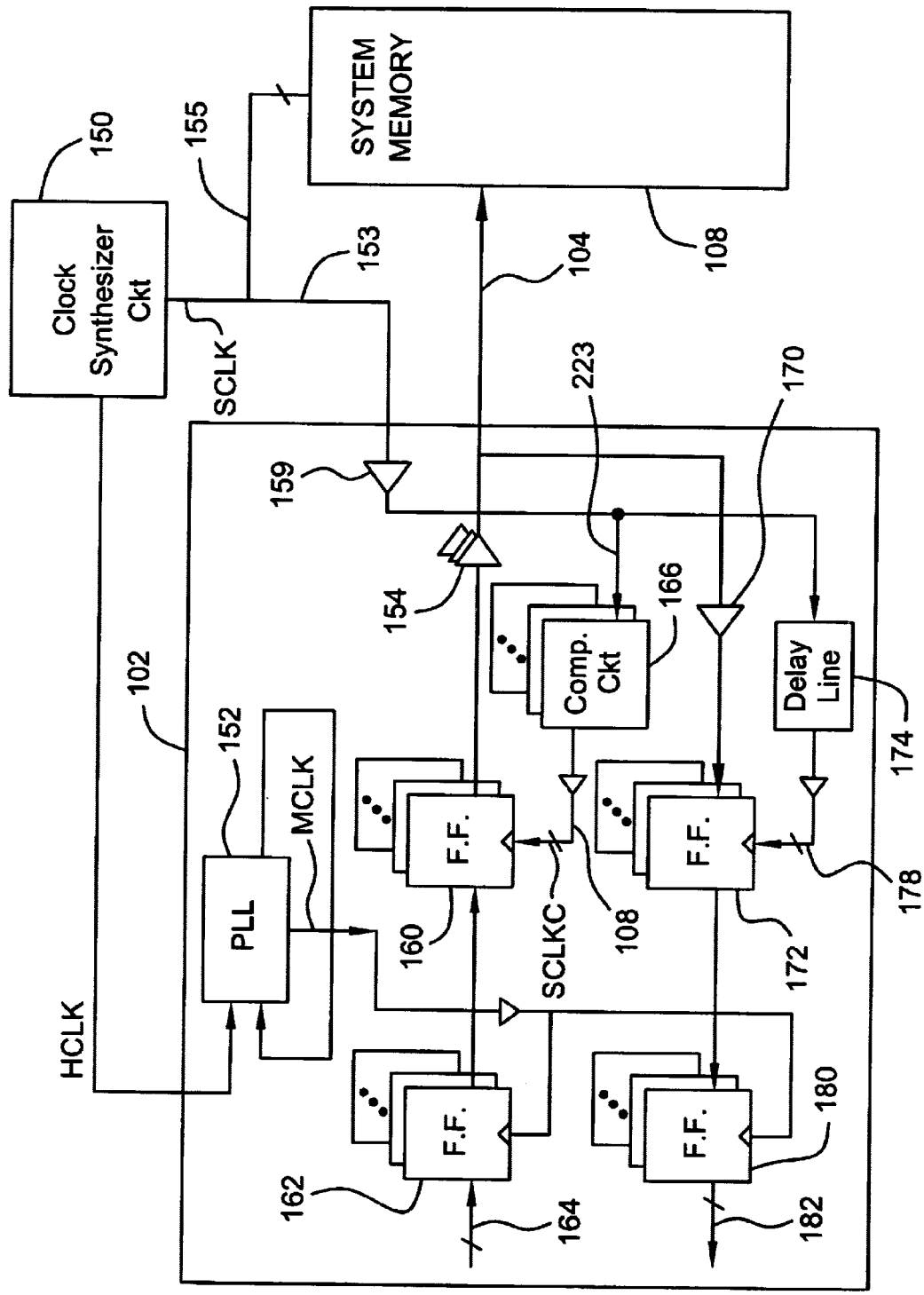
FIG. 2 is a more detailed schematic diagram of a portion of the computer system of FIG. 1 according to an embodiment of the invention.

More particularly, referring to FIG. 2, in some embodiments of the invention, the memory interface 102 includes data transmission signal buffers 154, each of which is associated with and is electrically loaded by a data line of the memory bus 104. In this manner, each data line may have a length and load that may effect the delay that the associated signal buffer 154 introduces to a particular data signal. Thus, each data buffer 154 introduces a delay that is a function of the load presented by its associated data line and the characteristics of the buffer 154 itself. For purposes of preventing these effects from delaying a particular data signal to a point where the data signal is substantially out of synchronization with the SCLK clock signal, the memory interface 102 includes a compensation circuit 166 for each data line.

Each compensation circuit 166 receives the SCLK system clock signal from the output terminal of a clock signal buffer 159 that has its input terminal coupled to a clock line 153. The clock line 153, in turn, communicates the SCLK system clock signal from a clock synthesizer circuit 150 (that may be external to the bridge 110) to the memory interface 102. Each compensation circuit 166 adjusts the timing of the received system clock signal to produce a compensated clock signal (called SCLKC) at an output terminal 108 of the compensation circuit 166. The SCLKC signal, in turn, is coupled to a clock input terminal of a transmission memory buffer, such as a D-type flip-flop 160, for example. In this manner, the flip-flop 160 stores a bit of data and in response to the SCLKC signal, furnishes a data signal that indicates the bit of data to the associated data line.

Figure 3:
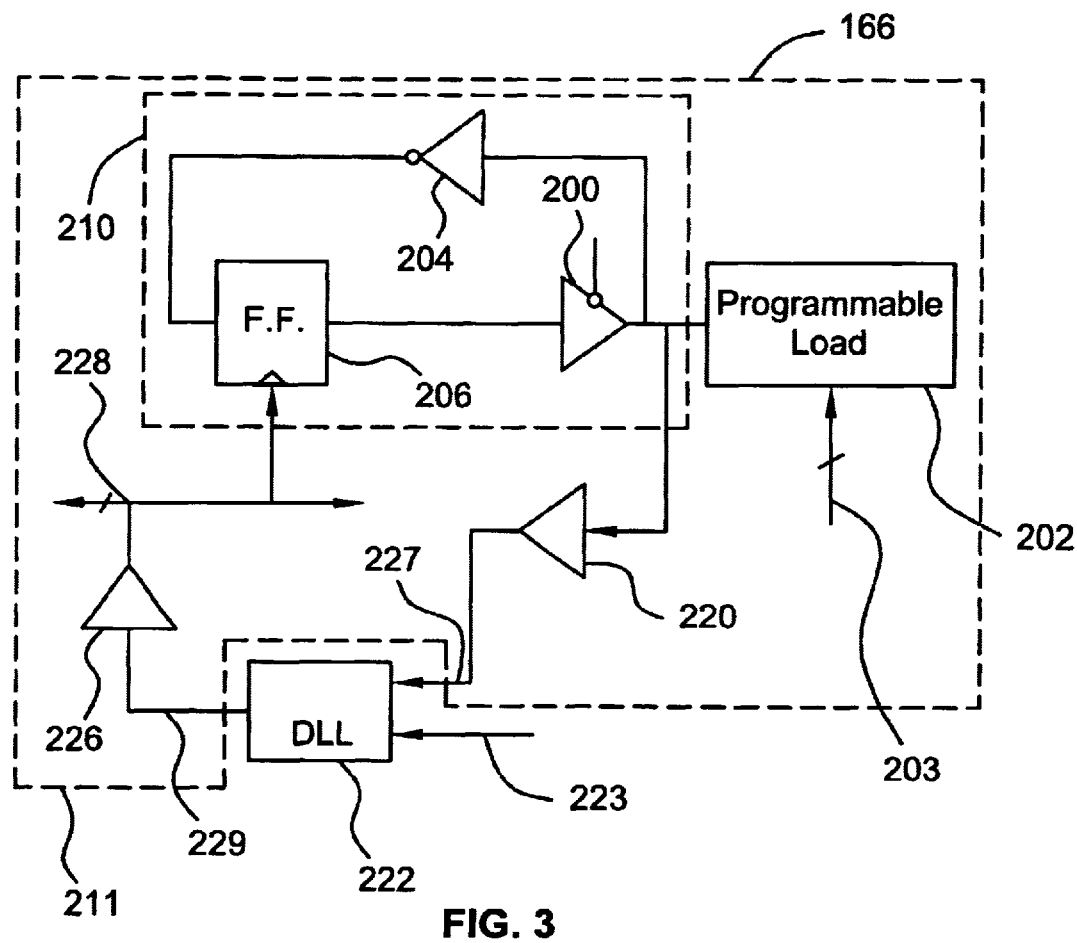
FIG. 3 is a schematic diagram of a compensation circuit of a memory interface of FIG. 2 according to an embodiment of the invention.

Referring to FIG. 3, in some embodiments of the invention, the compensation circuit 166 includes a delay locked loop (DLL) 222 that receives (at an input terminal 223 of the DLL 222) the SCLK clock signal from the clock line 153. The DLL 222 also receives another clock signal (described below) at another input terminal 227 and in response to the phase difference of these clock signals, the DLL 222 generates a clock signal at its output terminal 229 in an attempt to establish a predefined phase relationship (a zero degree phase relationship, for example) between the received clock signals that are present at the two input terminals 223 and 227. In this manner, a feedback circuit 211 is coupled between the output terminal 229 and the input terminal 227 so that the clock signal that is generated at the output terminal 229 regulates the clock signal that appears at the input terminal 227. In this way, the DLL 222 regulates the clock signal at the output terminal 229 to maintain a predefined relationship between the clock signals at the two input terminals 223 and 227.

In some embodiments of the invention, the feedback circuit 211 includes a signal buffer 200 that has substantially the same design as the data signal buffer 154. Furthermore, the output terminal of the signal buffer 200 is coupled to a programmable load 202 (a programmable capacitor bank, for example). The load 202 may be programmed (via input lines 203) to simulate the specific load of the associated data line. Thus, in this manner, before reaching the input terminal 227, the clock signal from the output terminal 229 passes through the signal buffer 200 (that is similar in design to the signal buffer 154) that is loaded by a load that is similar to the load that is experienced by the associated data signal buffer 154. As a result of this arrangement, the DLL 222 shifts the clock signal at the output terminal 229 forward in time to ensure that the clock signals at the input terminals 223 and 227 have the predefined phase relationship, thereby compensating for the delay that is introduced by the associated signal buffer 154.

The output terminal 229 of the DLL 222 may be coupled (via a signal buffer 226) to the clock input terminal of a D-type flip-flop 206 that has its non-inverted output terminal coupled to the input terminal of the signal buffer 200. The output terminal of the signal buffer 226 may provide clock signals to lines 228 to clock other operations in the memory interface 102. The input terminal of the flip-flop 206 is coupled (via an inverter 204) to the output terminal of the signal buffer 200. Thus, due to this arrangement, an oscillator is formed in which a clock signal appears at the output terminal of the signal buffer 200 in response to edges of the clock signal that is produced by the DLL 222. In some embodiments of the invention, the feedback circuit 211 also includes a signal buffer 220 that is coupled between the output terminal of the signal buffer 200 and the input terminal 227 to buffer the inverter 200 from any additional load.

Referring back to FIG. 2, among the other features of the memory interface 102, for each data line, the memory interface 102 may include a D-type flip-flop 162 that includes an input terminal 164 to receive a signal that indicates a bit to be transmitted to the associated data line. The non-inverted output terminal of each flip-flop 162 is coupled to the input terminal of one of the flip-flops 160, and each flip-flop 162 is clocked via a clock signal (called HCLK) that is provided by a host phase locked loop (PLL) 152 and is associated with the internal clock domain of the bridge 110. The interface 102 also includes a memory buffer, such as a D-type flip-flop 172, for each data line. In this manner, the input terminal of each flip-flop 172 is coupled (via an associated signal buffer 170) to an associated data line of the memory bus 104 and has its output terminal coupled to the input terminal of an associated flip-flop 180. The flip-flop 180, in turn, is clocked by the HCLK clock signal. For purposes of ensuring correct capture of the data from the memory bus 104 during a read operation, the memory interface 102 includes a delay line 174 to delay the SCLK clock signal to align the SCLK clock with the data eyes of the incoming data signals. The delay line 174 is coupled (via a signal buffer 178) between the output terminal of the signal buffer 159 and the clock terminal of the flip-flops 172.

Figure 4:
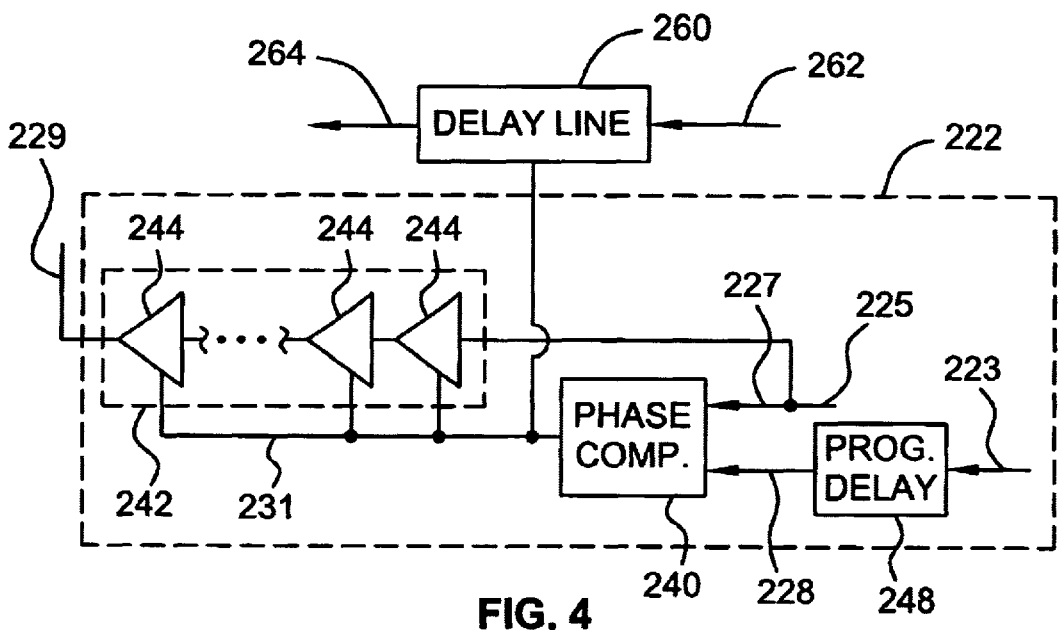
FIG. 4 is a schematic diagram of a delay locked loop of the compensation circuit of FIG. 3 according to an embodiment of the invention.

Referring to FIG. 4, in some embodiments of the invention, the DLL 222 may include a phase comparator 240 that compares the phase of the clock signal at the input terminal 227 of the DLL 222 with the phase of a clock signal that appears at an input terminal 228 of the phase comparator 240. The DLL 222 includes a programmable delay line 248 that is coupled between the input terminal 223 (of the DLL 222) and the input terminal 228 of the phase comparator 240. The delay line 248 may be programmed to adjust the predefined phase relationship between the clock signals at the input terminals 223 and 227 to adjust the "launch" of data for a particular data line. In this manner, the launch of the data signals for the data lines of the memory bus 104 may be staggered in groups to account for the different lengths and loads of the data lines. Furthermore, staggering the launches of the different data signals may also reduce the effects of switching noise.

The DLL 222 may also include a delay chain 242 that may be formed from, for example, a serial string of inverters 244. In this manner, the phase comparator 240 includes an output terminal 231 that may be coupled to an input terminal of each of the inverters 244. The signal present on the output terminal 231 sets the delay that is introduced by each of the inverters 244 and thus, sets the overall delay that is introduced by the delay chain 242. The output terminal of the last inverter 244 forms the output terminal 229 of the DLL 222.

As depicted in FIG. 4, in some embodiments of the invention, the DLL 222 may be coupled to a programmable delay line 260 that is coupled to the output terminal 231 to introduce a delay (between an input terminal 262 and an output terminal 264 of the delay line 260) that depends on the signal present on the output terminal 231 of the phase comparator 240. Thus, the delay line 260 may be used to introduce a delay to a signal other than a clock signal.

Referring back to FIG. 1, among the other components of the computer system 100, the computer system 100 may include a processor 112 (a microprocessor, for example) that is coupled to a local bus 114. The local bus 114 is coupled to the north bridge 110 along with an Accelerated Graphics Port (AGP) bus 116 and Peripheral Component Interconnect (PCI) bus 118. The AGP is described in detail in the Accelerated Graphics Port Interface Specification, Revision 1.0, published on Jul. 31, 1996, by Intel Corporation of Santa Clara, Calif. The PCI Specification is available from The PCI Special Interest Group, Portland, Oreg. 97214. The AGP bus 116 may be coupled to, for example, a graphics accelerator 120 that drives a display 130.

The computer system 100 may also include a south bridge 122 that is linked to the north bridge via a hub link 103. The south bridge 122 may include an input/output (I/O) expansion bus 124 and provide interfaces for a CD-ROM drive 126 and a hard disk drive 128. An I/O controller 134 may be coupled to the I/O expansion bus 124 and may receive input from a keyboard 136 and a mouse 138. The I/O controller 134 may also control operations of a floppy disk drive 140. Of course, the memory interface 102 may be used in computer systems other than the computer system 100.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. An apparatus comprising:

a memory buffer to provide a data signal to an output terminal of the memory buffer in response to a first clock signal;

a first signal buffer to be coupled between the output terminal of the memory buffer and a data line of a bus, the first signal buffer introducing a first delay;

a locked loop circuit to furnish the first clock signal to establish a predefined relationship between a phase of a second clock signal and a phase of a third clock signal;

a feedback circuit to produce the second clock signal in response to the first clock signal, the feedback circuit including a second signal buffer to introduce a second delay to the second clock signal, the second delay being approximately the same as the first delay introduced by the first signal buffer.

2. The apparatus of claim 1, wherein the first and second signal buffers are substantially identical.

3. The apparatus of claim 2, wherein the data line introduces a first load to the first signal buffer, the apparatus further comprises:

a load circuit coupled to the feedback circuit to introduce a second load to the second signal buffer that is approximately the same as the first load.

4. The apparatus of claim 3, wherein the load circuit includes an input terminal that is coupled to the feedback circuit.

5. The apparatus of claim 4, wherein the load circuit does not furnish any signals to the feedback circuit.

6. The apparatus of claim 3, wherein the load circuit is programmable to adjust a degree of the second load.

7. The apparatus of claim 1, wherein the data line introduces a first load to the first signal buffer, the apparatus further comprises:
   a load circuit coupled to the feedback circuit to introduce a second load to the second signal buffer that is approximately the same as the first load.

8. The apparatus of claim 1, further comprising:
   a delay line coupled to the locked loop circuit to establish the predefined phase.

9. An apparatus comprising:
   a memory buffer to provide a data signal to an output terminal of the memory buffer in response to a first clock signal;
   a signal buffer to be coupled between the output terminal of the memory buffer and a data line of a bus, the data line introducing a first load to the signal buffer;
   a locked loop circuit to furnish the first clock signal to establish a predefined relationship between a phase of a second clock signal and a phase of a third clock signal;
   a feedback circuit to produce the second clock signal in response to the first clock signal; and
   a load circuit coupled to the feedback circuit to introduce a second load to the feedback circuit that is approximately the same as the first load.

10. The apparatus of claim 9, wherein the load circuit includes input terminal that is coupled to the feedback circuit.

11. The apparatus of claim 10, wherein the load circuit does not furnish any signals to the feedback circuit.

12. The apparatus of claim 9, wherein the load circuit is programmable to adjust a degree of the second load.

13. A method comprising:
   routing a data signal through a first signal buffer to a data line of a bus, the first signal buffer introducing a first delay;
   furnishing a first clock signal to establish a predefined relationship between a phase of a second clock signal and a phase of a third clock signal;
   communicating the first clock signal through a second signal buffer to produce the second clock signal; and
   using the second signal buffer to introduce a second delay to the second clock signal, the second delay being approximately the same as the first delay introduced by the first signal buffer to the data signal.

14. The method of claim 13, wherein the first and second signal buffers are substantially identical.

15. The method of claim 13, wherein the data line introduces a first load to the first signal buffer, the method further comprising:
   introducing a second load to the second signal buffer that is approximately the same as the first load.

16. The method of claim 13, wherein the furnishing the first clock signal to establish a predefined relationship includes using a locked loop circuit.

17. The method of claim 16, further comprising:
   using a programmable delay line to establish the predefined phase.

18. A method comprising:
   routing a data signal through a first signal buffer to a data line of a bus, the data line having a first impedance;
   furnishing a first clock signal to establish a predefined relationship between a phase of a second clock signal and a phase of a third clock signal;
   communicating the first clock signal through a feedback circuit to produce a second clock signal in response to the first clock signal; and
   loading the feedback circuit with a second impedance substantially the same as the first impedance.

19. The method of claim 18, wherein the loading comprises: coupling a programmable load to the feedback circuit.

20. The method of claim 18, wherein the load circuit does not furnish any signals to the feedback circuit.

21. A computer system comprising:
   a memory buffer to provide a data signal to an output terminal of the memory buffer in response to a first clock signal;
   a processor to cause data to be stored in the memory buffer to cause the memory buffer to provide the data signal;
   a system memory;
   a memory bus coupled to the system memory;
   a first signal buffer to be coupled between the output terminal of the memory buffer and a data line of the memory bus, the first signal buffer introducing a first delay;
   a locked loop circuit to furnish the first clock signal to establish a predefined relationship between a phase of a second clock signal and a phase of a third clock signal;
   a feedback circuit to produce the second clock signal in response to the first clock signal, the feedback circuit including a second signal buffer to introduce a second delay to the second clock signal, the second delay being approximately the same as the first delay introduced by the first signal buffer.

22. The computer system of claim 21, wherein the first and second signal buffers are substantially identical.

23. The computer system of claim 22, wherein the data line introduces a first load to the first signal buffer, the apparatus further comprises:
   a load circuit coupled to the feedback circuit to introduce a second load to the second signal buffer that is approximately the same as the first load.

24. The computer system of claim 23, wherein the load circuit includes an input terminal that is coupled to the feedback circuit.

25. The computer system of claim 24, wherein the load circuit does not furnish any signals to the feedback circuit.

26. The computer system of claim 23, wherein the load circuit is programmable to adjust a degree of the second load.

27. The computer system of claim 21, wherein the data line introduces a first load to the first signal buffer, the apparatus further comprises:
   a load circuit coupled to the feedback circuit to introduce a second load to the second signal buffer that is approximately the same as the first load.

28. The computer system of claim 21, further comprising:
   a programmable delay line coupled to the locked loop circuit to establish the predefined phase.

* * * * *